United States Patent [19]

Biberger et al.

[11] Patent Number: 5,702,573
[45] Date of Patent: Dec. 30, 1997

[54] METHOD AND APPARATUS FOR IMPROVED LOW PRESSURE COLLIMATED MAGNETRON SPUTTER DEPOSITION OF METAL FILMS

[75] Inventors: Maximilian Biberger, Palo Alto; Dennis Conci, San Mateo, both of Calif.

[73] Assignee: Varian Associates, Inc., Palo Alto, Calif.

[21] Appl. No.: 592,909

[22] Filed: Jan. 29, 1996

[51] Int. Cl.$^6$ ................................................ C23C 14/35
[52] U.S. Cl. ............................ 204/192.12; 204/192.17; 204/298.06; 204/298.07; 204/298.2
[58] Field of Search .................... 204/192.12, 192.17, 204/298.06, 298.07, 298.19, 298.2

[56] References Cited

U.S. PATENT DOCUMENTS

| | | | |
|---|---|---|---|
| 4,094,764 | 6/1978 | Boucher | 204/298.06 |
| 4,155,825 | 5/1979 | Fournier | 204/192.13 |
| 4,175,029 | 11/1979 | Kovalsky et al. | 204/298.06 |
| 4,588,490 | 5/1986 | Cuomo et al. | 204/298.06 |
| 4,995,958 | 2/1991 | Anderson et al. | 204/298.2 |
| 5,108,569 | 4/1992 | Gilboa et al. | 204/192.13 |
| 5,252,194 | 10/1993 | Demaray et al. | 204/298.2 |
| 5,330,628 | 7/1994 | Demaray et al. | 204/192.12 |
| 5,593,551 | 1/1997 | Lai | 204/192.12 |

OTHER PUBLICATIONS

J. Musil et al., entitled "Unbalanced Magnetrons and New Sputtering Systems with Enhanced Plasma Ionization", published in *J. Vac. Sci. Technol.* (May/Jun. 1991), pp. 1171–1177.

S. Kadlec et al., entitled "Optimized Magnetic Field Shape for Low Pressure Magnetron Sputtering", published in *J. Vac. Sci Technol.* (Mar./Apr. 1995), pp. 389–393.

*Primary Examiner*—Aaron Weisstuch

[57] ABSTRACT

A method and apparatus are provided which increase the collimation of sputter deposited films by increasing the mean free path (MFP) of sputtered atoms so as to reduce redirecting collisions with the buffer gas. This is accomplished by reducing buffer gas pressure while employing mechanisms to maintain or increase plasma electron density so as to sustain the plasma in the absence of normally required gas pressure. A first mechanism used to permit reduced gas pressure is to provide gas flow directly to the immediate region of the plasma discharge rather than to another remote area of the sputter deposition chamber. A second mechanism used to permit reduced gas pressure is to provide an electron emitting source near the plasma discharge to increase the plasma electron density without requiring further ionization of buffer gas atoms. These two mechanisms can be used either alone or together, as desired, in view of the circumstances presented.

23 Claims, 7 Drawing Sheets

METHOD AND APPARATUS FOR IMPROVED LOW PRESSURE COLLIMATED MAGNETRON SPUTTER DEPOSITION OF METAL FILMS

BACKGROUND OF THE INVENTION

1. Field of the Invention

The present invention is directed to an apparatus and methods for its use in the fabrication of semiconductor devices and the like. More particularly, the present invention is directed to novel methods and structures for obtaining highly directional collimated physical vapor deposition (PVD) of a target metal onto a substrate using balanced magnetron sputtering under very low pressure conditions.

2. The Prior Art

In processing semiconductor wafers to form integrated circuits thereon, plasma-assisted processes are frequently used for depositing materials onto and etching materials from the semiconductor wafer. Such processes include plasma etching, reactive ion etching (RIE), plasma enhanced chemical vapor deposition (PECVD), as well as a number of other well known processes.

Magnetron sputtering is a well-known method of physical vapor deposition (PVD) for forming relatively pure thin films of desired materials on substrates of various types. Sputtering is currently the technique of choice for depositing many types of films onto semiconductor wafers in the fabrication of semiconductor devices such as very large scale integrated (VLSI) and ultra large scale integrated (ULSI) circuits and the like. Magnetron sputtering has become particularly widespread in semiconductor fabrication for the deposition of metallization layers of aluminum (Al). It has also been used to deposit thin films of other materials such as titanium (Ti), titanium nitride (TiN), titanium/tungsten alloy (TiW), and various precious metals.

As semiconductor geometries have shrunk, and the density of device components has increased, the demands on sputtering systems have commensurately increased. The typical specifications for sputtered films include such properties as the overall thickness uniformity of the deposited layer, step-coverage (i.e., the ability to cover irregular features on the substrate such as "steps"), and the ability to fill very narrow grooves (trenches) and interconnect vias. The typical specifications for each of these film properties are now substantially more stringent that they were only a few years ago, and it is expected that this trend will continue for the foreseeable future as semiconductor device manufacturers seek higher densities and greater performance. At the same time, the semiconductor wafers used in device fabrication have grown in size, so that wafers having an 8-inch/ 200 mm diameter form factor are now common and even starting to be supplanted by 12-inch/300 mm diameter form factor silicon wafers. The increase in wafer size magnifies the difficulty associated with attaining increasingly demanding film specifications across the entire surface of the wafer. For example, achieving a particular degree of film thickness uniformity over an eight-inch wafer is substantially more difficult than achieving the same degree of uniformity over a six-inch wafer.

In magnetron sputtering a plasma is created within a vacuum chamber adjacent to the surface of a sputter target comprising a material to be sputtered. The plasma is formed in a support gas, such as argon (Ar), which is introduced at low pressure into the vacuum chamber. (If reactive sputtering is to be performed, a reactive gas is then also introduced into the vacuum chamber.) An electrical potential is created within the vacuum chamber between the sputter target, which typically serves as the cathode of the sputtering system, and an anode. Typically this is achieved by grounding the sputter chamber structure and holding the cathode at a negative potential relative to that ground. Free electrons and electrons emitted from the cathode cause the support gas to be ionized thereby forming a plasma. A magnetic field is provided to confine the electrons near the cathode/target to enhance sputter yield, usually by a magnet system that produces field lines that loop through the surface of the target cathode. The magnetic field traps electrons, increasing the number of collisions between the electrons and the support gas atoms, thereby increasing the ion population and electron density and thereby intensifying the plasma. In semiconductor processing it is important that magnetrons used be of the "balanced" type, i.e., that no open magnetic field lines connect the discharge and the substrate. This will minimize bombardment of the substrate with electrons and ions. Such bombardment could damage the silicon substrate structure and/or devices already fabricated thereon. Unbalanced magnetrons are used for coating tools and similar thin film applications where device damage due to electron and ion bombardment of the coated surface is not a practical issue. Two background articles on unbalanced magnetron sputtering are (1) J. Musil et al., "Unbalanced magnetrons and new sputtering systems with enhanced plasma ionization", J. Vac. Sci. Technol. A 9 (3), May/June 1991, pp. 1171–1177; and (2) D. Kadlec et al., "Optimized magnetic field shape for low pressure magnetron sputtering", J. Vac. Sci. Technol. A 13 (2), March/April 1995, pp. 389–393, both of which are hereby incorporated herein by reference as if set forth fully herein.

The positive ions in the plasma are attracted to the sputter target surface which, as noted above, acts as the cathode in the system. Collisions between the positive ions and the surface of the target cause the target material to be ejected from the surface of the sputter target. The ejected atoms travel through the vacuum chamber and a portion of them impinge on the surface of the substrate forming a deposition film.

In order to meet the present and future anticipated specifications for sputtered films used in the manufacture of semiconductor devices, a variety of improvements to the basic magnetron sputtering system have been proposed and implemented. Most importantly, these include the use of closed-loop rotating magnet arrays to improve sputtered film uniformity and target utilization, and the use of collimating filters to improve the filling of small diameter vias and narrow grooves.

Closed-loop rotating magnet arrays are used to create a closed-loop magnetic tunnel to confine a plasma which is swept across the face of the sputter target as the magnet is rotated. Examples of such systems are described in U.S. Pat. No. 4,995,958 (the '958 patent) and U.S. patent application Ser. No. 07/471,251, now U.S. Pat. No. 5,252,194 (the '251 application), commonly assigned herewith, the disclosures of which are both hereby incorporated herein by reference as if set forth fully herein. Briefly, the '958 patent teaches how to construct a generally heart-shaped closed-loop magnet to create an arbitrarily determined erosion profile (for example, uniform erosion), over a large portion of the sputter target. The '251 application extends the teachings of the '958 patent to obtain erosion in the central portion of the sputter target. The teachings of these two disclosures extend to targets that are dish-shaped. Dish-shaped includes planar, convex, concave shapes as well as combinations thereof and arbitrarily-shaped profiles.

As feature size decreases, it becomes more and more difficult to obtain uniform deposition in high aspect ratio structures (small diameter, deep structures). An example of a typical high aspect ratio structure is a via hole etched through silicon. The aspect ratio is simply the ratio of the depth of the via to its diameter. A round via one micron deep and one micron in diameter has an aspect ratio of one. Such vias are large by today's standards and such aspect rations are low. Many typical processes maintain a common dielectric layer thickness of about one micron while shrinking surface features to 0.25 micron and below with resultant aspect ratios of 4 and higher. FIG. 1 depicts a typical via 10 etched through a portion of a dielectric layer 12 deposited on a silicon substrate 13. Ideally, a process could be developed to deposit a metallization layer 14 of a given thickness 16 across the substrate 12 both on the surface 18 and at the bottom of the deepest via 20, thus achieving 100% bottom coverage. Unfortunately, available processes do not permit such an ideal outcome. More typical of commercially available processes today is the outcome depicted in FIG. 2. As can be seen in FIG. 2, the deposited metal film 22 is thickest on the substrate 12 away from the via 24, very thin at the bottom of via 24, and additionally unevenly coats the walls 26 of via 24.

One of the reasons that ideal deposition is not possible with prior art systems is the fact that in general, magnetron sputtering must take place in a gas such as Argon (Ar) which is required in order to make and sustain the plasma. Turning to FIG. 3, a typical magnetron sputter deposition arrangement is shown. A target 28 comprising, for example, Ti, Al or another suitable metal to be sputter deposited is placed in a sputter deposition chamber of a magnetron sputter deposition apparatus. A silicon wafer 30 upon which the metal from target 28 is to be deposited is disposed at a distance from target 28. Argon gas at a typical pressure of between about 2 millitorr and 8 millitorr is provided between target 28 and wafer 30. The mean free path ("MFP") of the material sputtered from target 28 is well known to be linearly and inversely related to gas pressure. Thus doubling the gas pressure halves the MFP, all else being held equal. Ti, for example, under standard conditions used for magnetron sputter deposition, has a MFP of approximately 1.6 cm at 2 millitorr of Argon. In a typical magnetron sputter deposition chamber, the wafer 30 and the target 28 may be separated by a distance on the order of about 8–15 cm. This represents several MFP lengths. The MFP is, of course, the mean distance that a sputtered atom of target material can travel before striking an Ar atom and thus changing its direction of travel. Were there no gas atoms in the way, ideal sputter deposition would be relatively easy to achieve with a simple collimator structure. Once collimated, essentially all sputtered atoms which made it through the collimator could be expected to travel directly from the collimator output to the wafer in an essentially perfectly vertical trajectory (e.g., trajectory 32 in FIG. 3). It is collisions with Ar atoms after collimation, e.g., at 34, which cause redirection of sputtered material so that it is not traveling in a perfectly vertical orientation directly toward the wafer even after collimation.

An example of a sputtering system comprising a collimation filter 40 is found in U.S. patent application Ser. No. 07/471,212, now U.S. Pat. No. 5,330,628 (the '212 application), commonly assigned herewith, the disclosure of which is hereby incorporated herein by reference as if set forth fully herein. As described in that application, a collimation filter may be used to limit the angles of incidence of sputtered atoms which impinge upon the surface of the substrate. By limiting the angles of incidence it is possible to promote deposition on the bottom and side walls of, for example, a small diameter hole or "via". With the apparatus and method taught in the '212 application, sputtering has been successfully used to deposit high quality films into vias having diameters of less than 0.5 microns.

Such sputter collimators are typically an array of uniform hexagonal openings in a honeycomb structure formed of a suitable material such as Ti for Ti or TiN deposition or stainless steel for Ti deposition. Collimators are generally described by their aspect ratio and the distance between two opposing faces of one of their hexagonal openings, i.e., 1:1×⅝" refers to a collimator having a 1:1 aspect ratio and a hexagonal "diameter" of 0.625" (i.e., 0.625" thick×0.625" openings). Such collimators operate by absorbing errant sputtered atoms (e.g., 42, 44) through collision and preventing them from reaching wafer 30. While fit for their intended purpose, a drawback of using a collimator alone is that where a large percentage of sputtered atoms are "off target", the collimator can significantly extend the time needed to lay down a layer of sputtered material of a given thickness.

Use of a collimation filter requires that the sputter source have highly uniform emission characteristics. Thus, collimation was not a practical technique until a sputter source with suitable uniform emission characteristics was available, such as the sputter source described in the '251 application. Moreover, collimation requires the use of relatively low pressure sputtering because the scattering that occurs at normal sputtering pressures tends to negate the effects of the filter, i.e., at normal sputtering pressures a substantial number of atoms of sputtered material are scattered in collisions with gas atoms after they have passed through the collimator (see, e.g., 34 in FIG. 3), thus losing the directionality imparted by the collimator.

Aside from the need to operate a collimated sputtering system at low pressure to avoid gas scattering, there are several other advantages of low pressure sputtering as described below.

A typical magnetron sputtering source has a minimum pressure at which a plasma discharge will be initiated, and a lower minimum operating pressure at which the plasma discharge can be sustained. Nonetheless, as a practical matter for commercial semiconductor fabrication equipment, the magnetron must always be operated above the ignition pressure. This is to protect the system in case the plasma should extinguish for some reason. In theory, after a stable discharge is initiated, the operating pressure may be lowered, so long as it does not fall below the minimum operating pressure. However, in a commercial environment, the risk of plasma extinguishment, with the attendant disruption of operation and possible damage to the wafers being processed, is too great to take advantage of this feature of plasma discharge physics.

It has been observed that the plasma adjacent a dish-shaped target with a closed-loop magnet behind it tends to spread out as the operating pressure of the sputtering chamber is lowered. The area of the target which is eroded by sputtering caused by the plasma is sometimes referred to as the discharge track. In order to sustain the operation of a magnetron, the rate of generation of discharge electrons has to be greater than or equal to the rate of loss of such electrons. Due to the reduced collision rate brought about by lower gas pressures, the electrons in a magnetron discharge tend to move to higher orbits in the magnetic field as the pressure is lowered. As a result, the discharge track will widen and cover a larger area of the target at lower pressures. When the edge of the discharge track extends beyond the edge of the target, the plasma appears to extinguish due to degradation of the electron confinement. More precisely, the plasma does not entirely extinguish, but it is transformed into a low level Penning discharge. The intensity of this Penning discharge is too low to provide a useful deposition rate onto the substrate.

From the above observations, it appears that one method of lowering the pressure at which the plasma in a given chamber will extinguish is to simply employ a larger sputter target, such that the edge of the discharge track is able to "spread out" more before it reaches the edge of the target. This is not a very satisfactory solution for at least two reasons. First, employing a larger sputter target will result in less efficient target usage. Since sputter targets can be quite expensive, every effort is normally made to maximize efficiency of use, consistent with the ability to meet sputtered film specifications. Second, the diameter of the sputter target, which is typically wider than the wafer undergoing processing, usually determines the width of the vacuum chamber. For example, in commercial sputtering systems sold by the assignee of the present invention, a target somewhat less than about twelve inches in diameter is used with eight-inch diameter wafers. Use of a significantly larger target would also require that the sputtering chamber be enlarged in some cases. This is undesirable for several reasons, including added manufacturing expense, greater pump down times (or larger pumps) and larger overall system size.

Several other techniques have been used to reduce the operating pressure of a sputtering system. One such technique is to use a hollow cathode discharge to assist the magnetron discharge. The hollow cathode technique has the added advantage of operating at relatively low voltages. However, in known prior art systems, the hollow cathode is operated within the magnetic field of the magnetron and is coated during system operation. This will eventually lead to particulate problems as flaking of coating material off of the hollow cathode occurs, or will dictate frequent hollow cathode cleaning, with a resulting disruption of system usage. In addition, known hollow cathode systems lack cylindrical symmetry, resulting in non-uniform coatings when operating at higher pressures or with larger magnetrons.

Another technique is to operate a sputtering source without a support gas at very high power density to achieve self-sustained sputtering. In this technique, the atoms of sputtered material become ionized and sustain the plasma without the need for a buffer gas. This technique appears to be restricted to a limited range of materials, such as silver, gold and copper, which have self-sputtering yields greater than unity. Because of the very high power densities needed to achieve self-sputtering, it is quite difficult to adjust the deposition rate, which is an important process parameter. (It is to be noted that a support gas at relatively high pressure is still needed to strike the discharge, before going to low pressure operation.)

Yet another technique employs an anti-cathode to achieve low pressure operation. This method prolongs the time that ions stay in the discharge region by using a minimum intensity magnetic field configuration and electrostatic confinement of ions by means of a virtual cathode. Known embodiments of this type of system result in intense ion bombardment of the substrate, which is undesirable in most semiconductor applications in view of the high risk of damage to devices that have already been formed on the wafer. Moreover, the magnetic geometry used in known anti-cathode systems is likely to result in films which lack highly uniform thickness.

Low pressure sputtering can be accomplished using multipolar magnetic confinement to enhance gas ionization. This technique also may cause unacceptably high ion bombardment of the substrate and is highly sensitive to the relative positions of the magnetron and the multipolar magnets making it difficult to reliably duplicate process results.

Another problem with some of the above solutions to low-pressure sputtering is that the systems do not operate efficiently over a wide range of pressures. While some may function well at low pressure, they do not work well when the pressure is raised. On the other hand, the pressure at which a film is deposited can influence the properties of the film. Thus, operating pressure can be used as a variable in optimizing a process to create a film with desired properties. It is, therefore, desirable to have a system that can function not only at very low pressure but over a wide range of pressures.

U.S. patent application Ser. No. 08/058,153 filed May 5, 1993 (now U.S. Pat. No. 5,593,551) and commonly assigned herewith (the '153 application) is hereby incorporated herein by reference as if set forth fully herein. The '153 application describes a sputtering apparatus and method in which the discharge track is confined by a peripheral bucking magnet ring assembly 46 positioned adjacent to the edge of a dish-shaped sputter target. The bucking magnet principle shown in FIGS. 4–5 uses opposing magnets at the edge 48 of the target 50 to push the magnetic field lines 52 of the main magnetron 54 back onto the target 50. Each magnet has a north-south polar axis defined as an axis passing through both the north pole (N-pole) and the south pole (S-pole) of the magnet. Opposing magnets as described here defines the N-poles of magnets in the bucking magnet ring assembly adjacent to north poles of the rotating magnetron assembly and oriented inwardly toward the rotation axis of the rotating magnetron (i.e., the N-pole is closer to the rotation axis than the corresponding S-pole of the same magnet). By preventing the spread of the discharge track beyond the edge of the target as the operating pressure is lowered, both the ignition and extinction pressures of a magnetron can be significantly reduced. Besides the obvious benefit of lowering the operating pressure of a magnetron, the bucking magnet also has many desirable properties. Due to the much improved edge electron confinement, a bucking magnet can significantly improve the discharge efficiency and thus the electron density of the discharge of a magnetron even at regular sputtering pressures (about 2 millitorr). The bucking magnet also has the desirable effect of lowering the impedance of the sputtering source and increasing its emissions due to the increase in electron densities within the discharge brought about through enhanced confinement. While N-poles of bucking magnet ring assembly 46 have been shown in an "inward" orientation with the N-poles of magnetron assembly 54 in an "outward" orientation to produce opposed magnetic field lines, the system would work as well in a reversed configuration with the N-poles of the bucking magnet ring assembly 46 in an "outward" configuration and the N-poles of magnetron assembly 54 in an "inward" configuration because the magnetic fields would still be in opposition to one another pushing the magnetron field lines inwardly and away from the edge of the sputter target.

Accordingly, a need exists for a method and/or apparatus which will increase the uniformity of bottom coverage of deposited metal films in vias.

SUMMARY OF THE INVENTION

The present invention increases the collimation of sputter deposited thin films by increasing the mean free path (MFP)

of sputtered atoms so as to reduce redirecting collisions with the buffer gas. This is accomplished by reducing buffer gas pressure while employing means to maintain or increase plasma electron density so as to sustain the plasma in the absence of normally required gas pressure.

A first mechanism used to permit reduced gas pressure is to provide gas flow directly to the immediate region of the plasma discharge rather than to another remote area of the sputter deposition chamber.

A second mechanism used to permit reduced gas pressure is to provide an electron emitting source near the plasma discharge to increase the plasma electron density without requiring further ionization of buffer gas atoms.

These two mechanisms can be used either alone or together, as desired, in view of the circumstances presented.

OBJECTS AND ADVANTAGES OF THE INVENTION

Accordingly, it is an object of the present invention to provide a more collimated metal film sputter deposition.

It is a further object of the present invention to provide a method and apparatus for achieving more uniform bottom coverage of high aspect ratio vias with sputtered metal films.

It is a further object of the present invention to provide a method and apparatus for achieving a higher percentage of bottom via coverage with sputtered metal films of a given thickness.

It is a further aspect of the present invention to provide a method and apparatus for reducing the buffer gas pressure required in order to sputter deposit metal films in a sputter deposition chamber.

It is a further aspect of the present invention to provide a sputter deposition apparatus capable of operating with increased collimation.

It is a further aspect of the present invention to provide a sputter deposition apparatus capable of operating at reduced buffer gas pressure.

It is a further object of the present invention to provide an apparatus and method for achieving low-pressure, high-rate, magnetron sputtering.

It is a further object of the present invention to provide an apparatus and method for achieving high-rate, low-pressure magnetron sputtering from a dish-shaped sputter target that does not require significant physical modification to existing devices.

It is a further aspect of the present invention to provide a sputter deposition apparatus capable of operating with buffer gas injection directly to the region of the plasma for a reduction in necessary buffer gas operating pressure.

It is a further aspect of the present invention to provide a sputter deposition apparatus capable of operating with electron injection directly to the region of the plasma for a reduction in necessary buffer gas operating pressure.

It is a further aspect of the present invention to provide a sputter deposition apparatus capable of utilizing direct electron injection with a field emission electron source for injecting electrons directly into the region of the plasma for a further reduction in necessary buffer gas operating pressure.

Yet a further aspect of the present invention to provide a sputter deposition apparatus capable of utilizing direct electron injection with a filament-type electron source for injecting electrons directly into the region of the plasma for a further reduction in necessary buffer gas operating pressure.

These and many other objects and advantages of the present invention will become apparent to those of ordinary skill in the art from a consideration of the drawings and ensuing description of the invention.

DESCRIPTION OF THE PREFERRED EMBODIMENTS

Those of ordinary skill in the art will realize that the following description of the present invention is illustrative only and is not intended to be in any way limiting. Other embodiments of the invention will readily suggest themselves to such skilled persons from an examination of the within disclosure.

In accordance with a first aspect of the present invention, buffer (plasma support) gas injection into the magnetron sputtering chamber is directed directly into the region of the plasma. In this way, gas atoms are efficiently used by the plasma and converted to ions and electrons without unnecessarily adding to the overall pressure of the sputter chamber. Accordingly, the overall pressure of the sputter chamber may be reduced because adequate buffer gas is provided where it is needed, i.e., at the plasma forming region, and not elsewhere in the chamber where it serves only to increase overall pressure and the likelihood of collisions with sputtered material.

Figure 1:
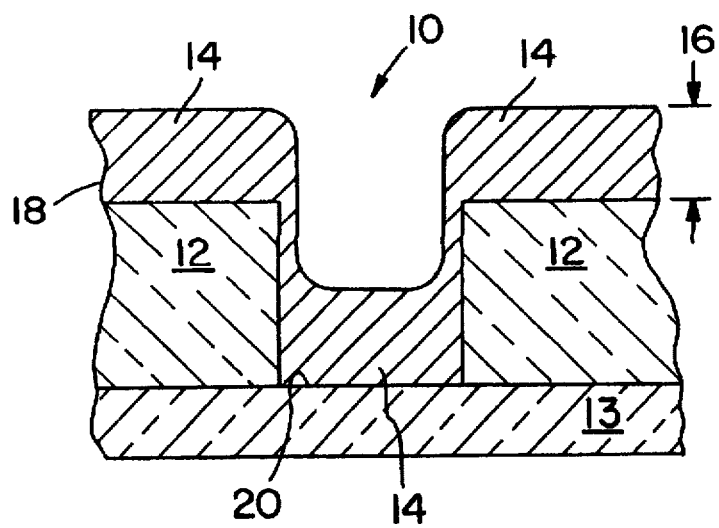
FIG. 1 is a cross sectional diagram of an ideal metal film deposition having a high degree of deposited film thickness uniformity between upper substrate surface and via bottom.
Figure 2:
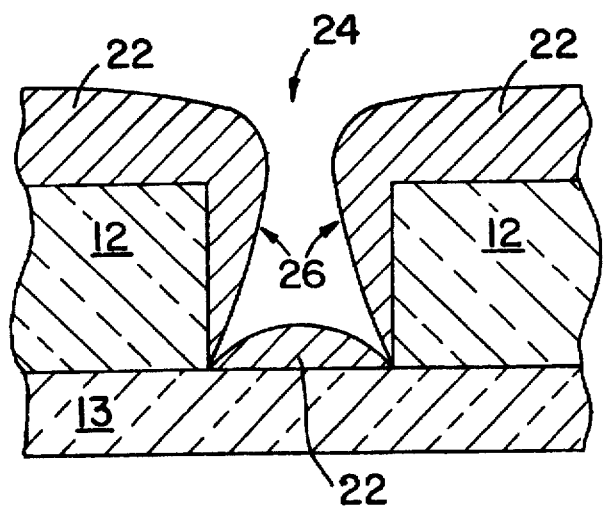
FIG. 2 is a cross sectional diagram of a typical metal film deposition having a low degree of deposited film thickness uniformity between upper substrate surface and via bottom.
Figure 3:
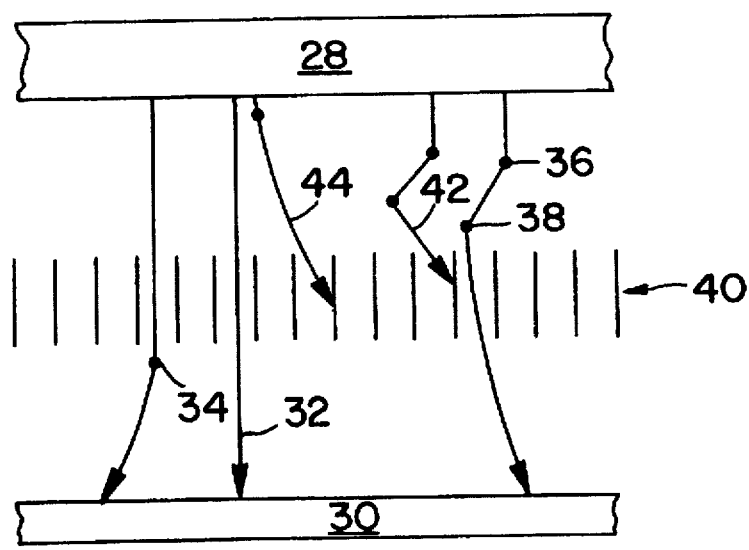
FIG. 3 is a diagram showing sputter deposition interactions with buffer gas atoms and collimator structures.
Figure 4:
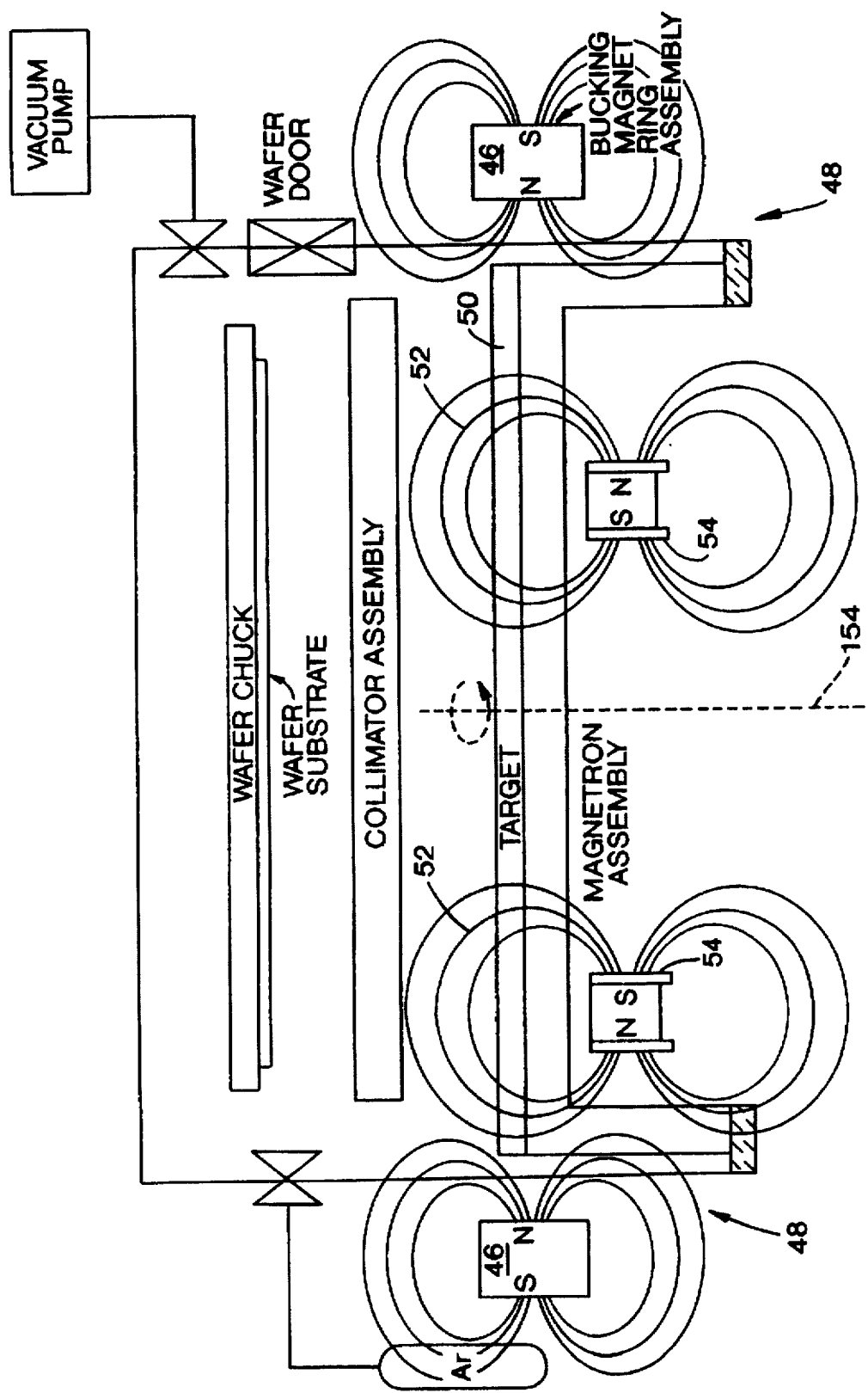
FIG. 4 is a schematic drawing of a prior art balanced magnetron sputter deposition chamber incorporating a heart-shaped rotating magnetron and a bucking magnet assembly.
Figure 5:
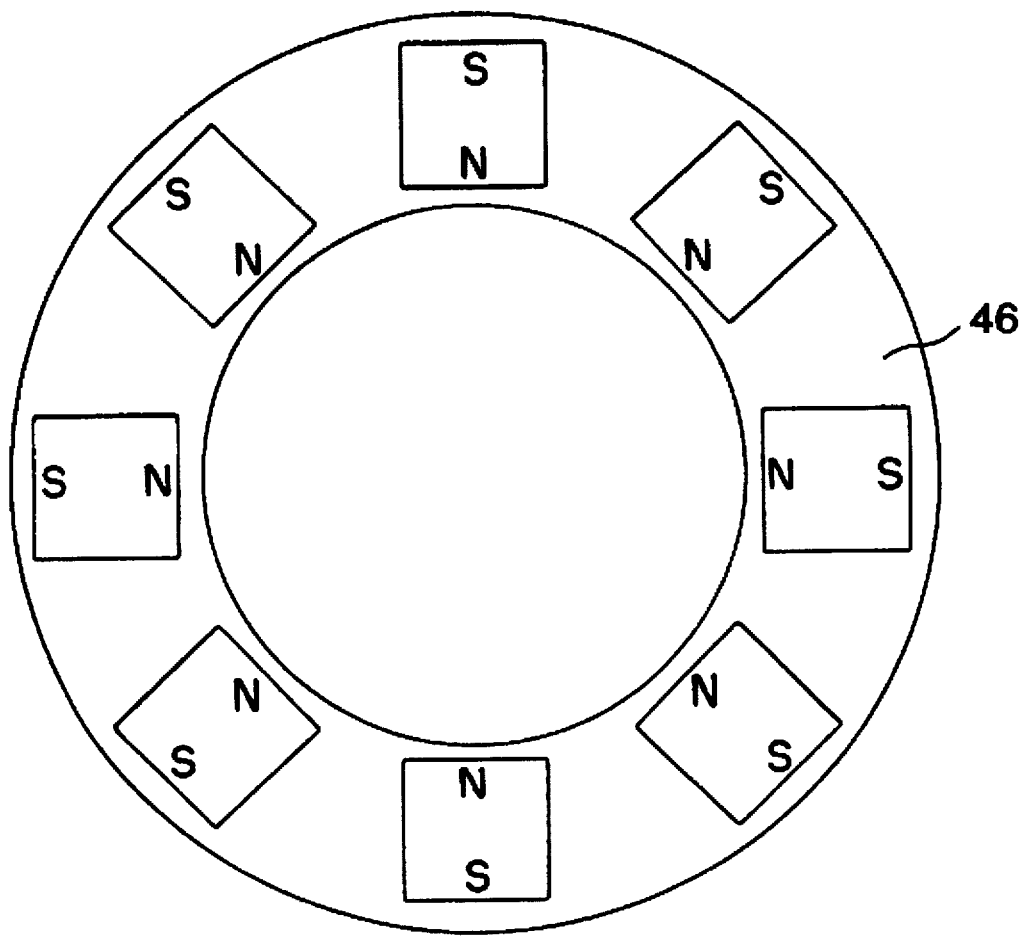
FIG. 5 is a top plan view of a bucking magnet assembly as used with the magnetron sputter chamber shown in FIG. 4.
Figure 6:
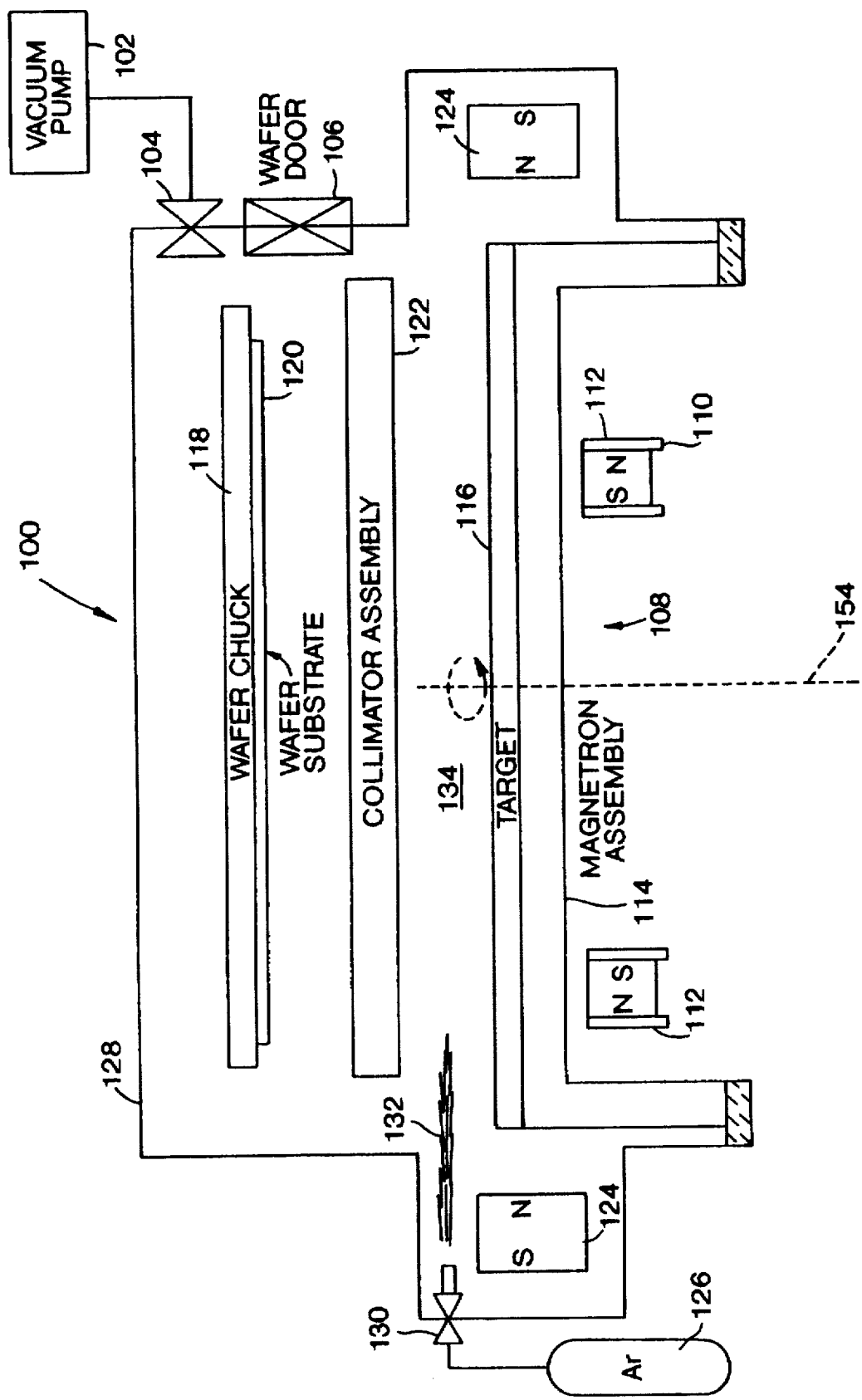
FIG. 6 is a schematic drawing of a balanced magnetron sputter deposition chamber according to a preferred embodiment of the present invention.

Turning now to FIG. 6, a schematic diagram of a preferred embodiment of the present invention is disclosed. Sputter chamber 100 resembles the sputter chamber of FIG. 4 in many respects. It includes vacuum pump 102 and corresponding valve 104, a wafer door 106, a rotating magnetron assembly 108 preferably including a heart-shaped magnet assembly 110 with the north poles of permanent magnets 112 all facing outwardly as shown. A sputter target assembly 114 is included with a conventional target material layer 116 which may be of a material it is desired to deposit on the wafer. A conventional wafer chuck 118 is included for holding a wafer 120 preferably of silicon or another suitable material for use in forming circuits thereon. While this embodiment is shown in a particular orientation, other orientations could be used as well without departing from the inventive concepts herein, for example, the wafer could be held with the side to be coated facing up instead, or it could be held with the edge vertical, or it could be held at an arbitrary orientation. A conventional collimator assembly 122 as described above is disposed between the wafer 120 and the target 116. A bucking magnet assembly 124 is disposed about the periphery of target 116. The principal difference here is that buffer gas supply 126, preferably of Ar (or an Ar/Nitrogen combination where it is desired to lay down a film of TiN) and connected to the vacuum envelope 128 of sputter chamber 100 via a control valve 130 is provided with direct plasma gas injection means for directing the flow of gas 132 released into vacuum envelope 128 toward the space between the collimator assembly 122 and the target 116. In this way, gas that is let into the sputter chamber 100 is directed precisely to the region of plasma discharge 134 (plasma formation region) where it can be directly used for the purpose of sustaining the plasma without unnecessarily increasing overall system pressure. Prior art devices known in the art release the buffer gas into the area shielded from the plasma formation region 134. This results in a pressure gradient across the chamber with the highest pressure naturally adjacent the gas inlet and away from the plasma formation region. The present invention also results in a gas pressure gradient, but because the gas inlet is not separated from the plasma formation region by shields which restrict gas flow, the highest pressure is in and near the plasma formation region (i.e., near the gas inlet 130), dropping off toward the vacuum pump outlet 104. The consequence is, that for a particular desired gas pressure in the plasma formation region, less gas pressure is required when the inlet is adjacent the plasma formation region than is required when the inlet is distant from and/or shielded from the plasma formation region due to pressure gradient formation.

Figure 7:
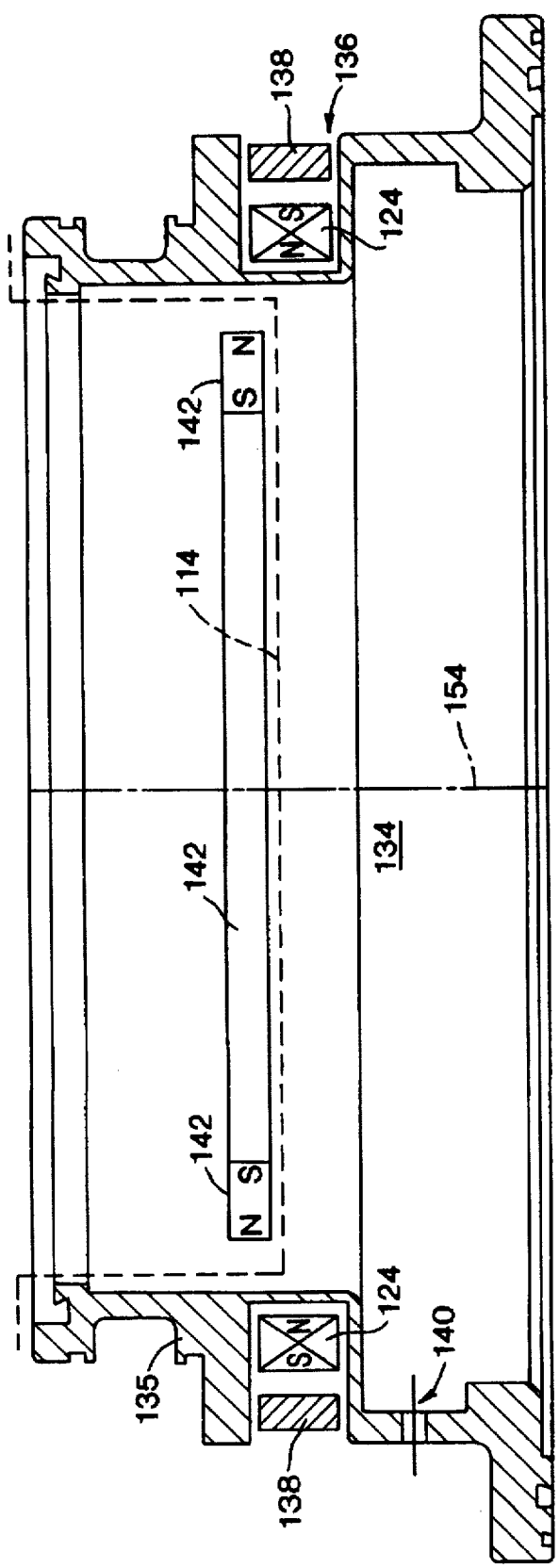
FIG. 7 is a cross sectional drawing of a dark space ring for use with a balanced magnetron sputter deposition chamber according to a preferred embodiment of the present invention.

In a presently preferred embodiment of the present invention as shown in FIG. 7 (a reversed configuration from the embodiment shown in FIG. 6), a so-called dark space ring 135 provides a seat for target assembly 114 and retains within groove 136 bucking magnet assembly and an aluminum backing ring 138. Dark space ring 135 is located between the collimator assembly and the sputter target. Valve 130 is connected to aperture 140 in dark space ring 135 and provides gas directly to the plasma formation region 134. One or more apertures 140 may be provided as desired. A single aperture 140 is presently preferred. Spacer rings (not shown) may be included to adjust the vertical position of bucking magnet assembly 124 either up or down as desired. Magnetron assembly 142 rotates behind target assembly 114.

Figure 8:
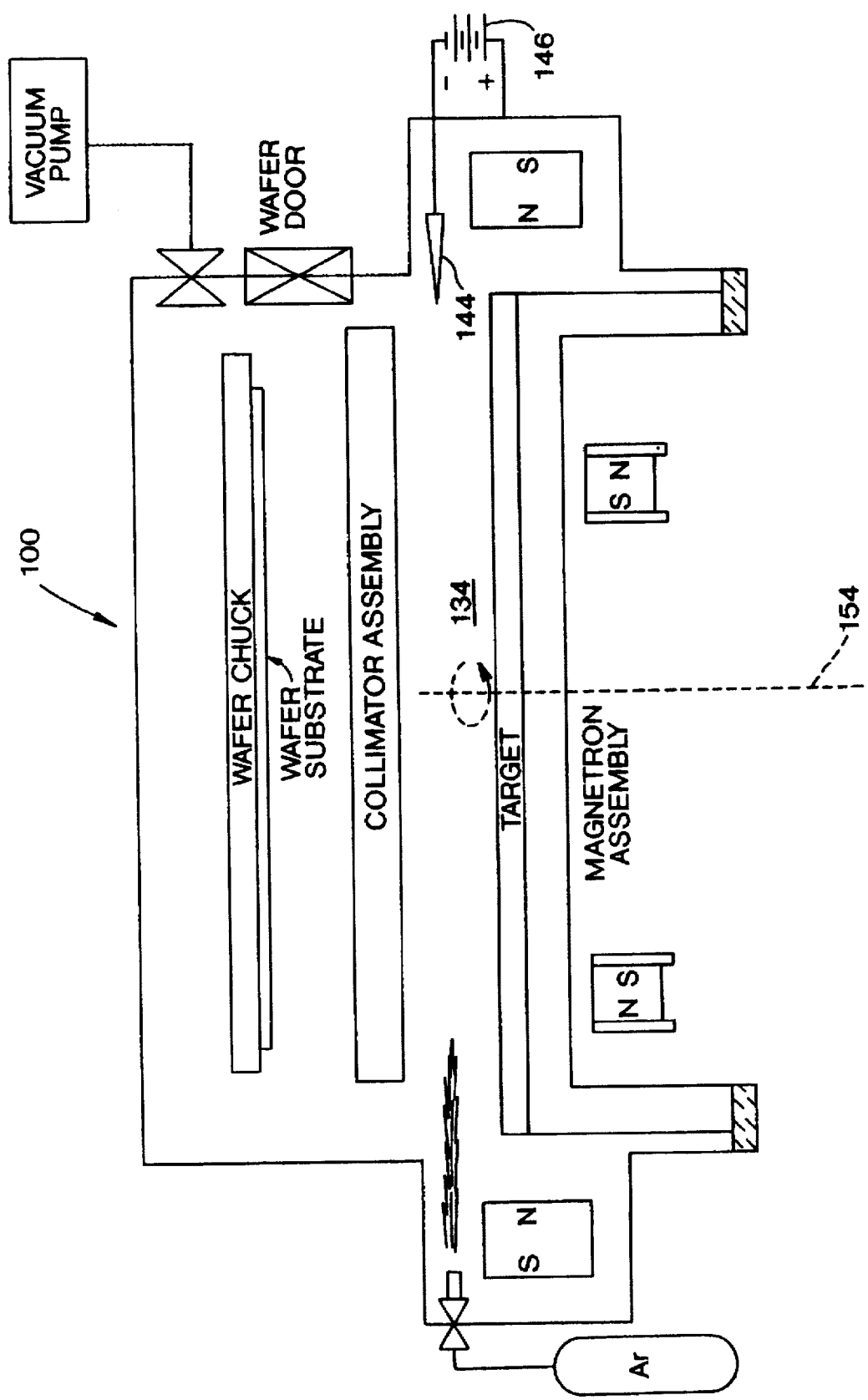
FIG. 8 is a schematic drawing of a balanced magnetron sputter deposition chamber according to another preferred embodiment of the present invention.

Turning now to FIG. 8, another mechanism for permitting magnetron sputtering at even lower pressures is shown. It is to be noted that this mechanism may be used in conjunction with direct plasma gas injection or alone, as desired for the circumstances presented. In FIG. 8 electron field emission probe 144 is disposed adjacent plasma formation region 134 as shown. Probe 144 is biased at about −10 VDC to a maximum of about −100 VDC relative to plasma chamber 100 with a conventional current limited DC power supply 146. Electrons will be ejected from probe tip 144 and will enter the plasma region 134 without the need for a corresponding increase in gas pressure or ions in the system. In this way, loss of electrons to the wall or otherwise may be compensated for without simply dumping more gas (which then has to be ionized) into the system. Lower operating pressures are thereby permitted, or more stable operation at higher pressures is likewise permitted. One or more probes 144 may be used to achieve sufficient electron injection and injection rates may be controlled by varying the output of power supply 146. Probe 144 may be installed in a suitable aperture with suitable insulation in dark space ring 135 of FIG. 7.

Figure 9:
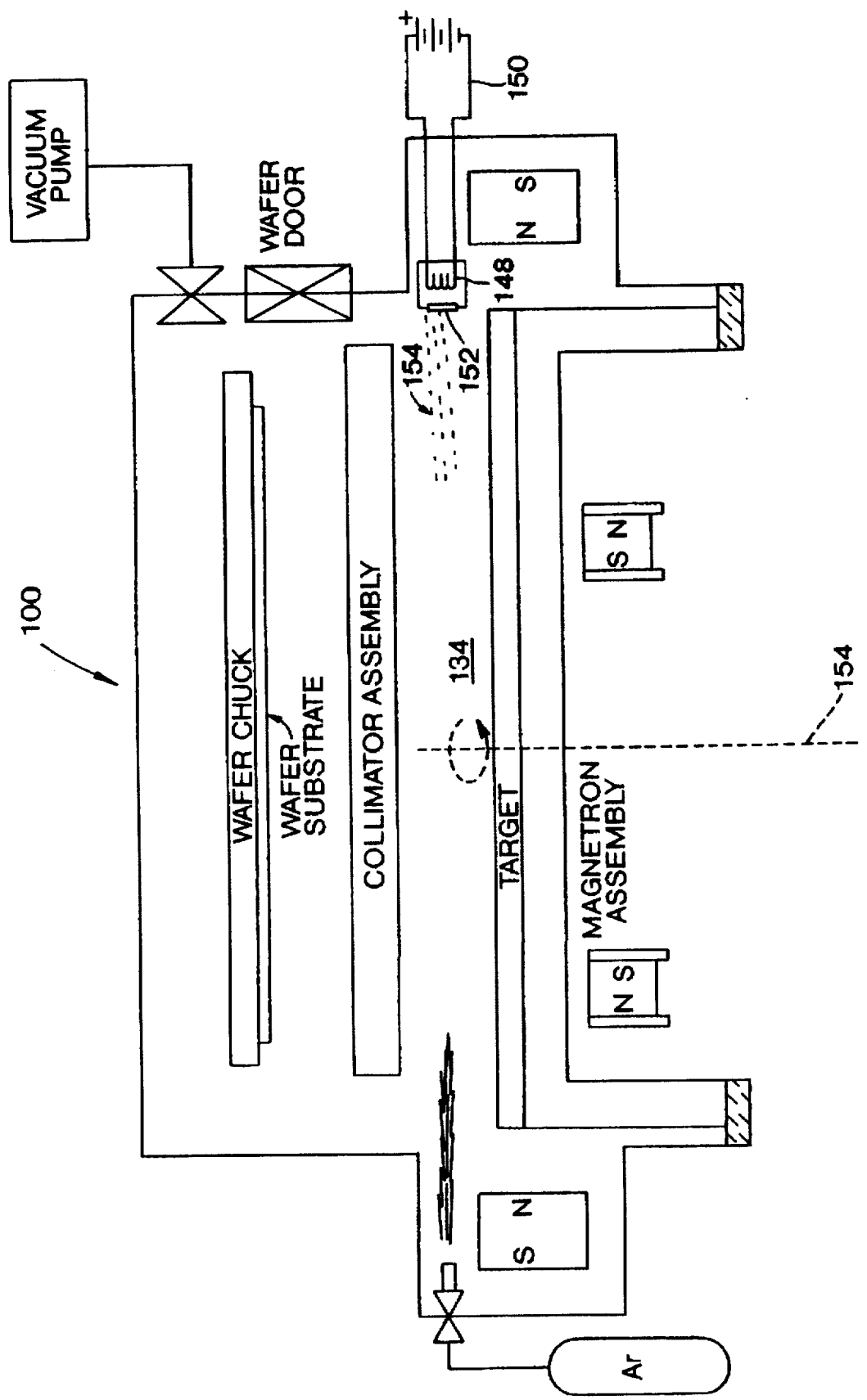
FIG. 9 is a schematic drawing of a balanced magnetron sputter deposition chamber according to yet another preferred embodiment of the present invention.

In FIG. 9 a configuration similar to FIG. 8 is shown. In the case of the embodiment of FIG. 9, however, instead of electron injection by means of the field emission mechanism, electron injection by means of electron emission is utilized. Heater 148 is provided with a suitable heater power supply 150. Upon application of suitable power to heater 148, heater 148 will cause emitter 152 to heat to the point where it readily emits electrons 154 into plasma formation region 134. Such mechanisms are well understood in the vacuum tube art. Emitter 152 preferably comprises a highly emissive high temperature material such as thoriated tungsten and should be constructed so as to minimize the possibility of contamination of the wafer substrate. One or more electron emitters may be used as desired and those of more than one type may be mixed if desired.

While the permanent magnets 112 of the rotating magnetron magnet assembly 110 have been shown with their N-poles all oriented away from magnetron rotation axis and the permanent magnets of the bucking magnet ring assembly 46 have been shown with their N-poles all oriented toward the magnetron rotation axis 154, the invention would work as well if all the permanent magnets were rotated 180 degrees, i.e., reversed pole for pole. The key is that the magnetic fields caused by the respective magnet assemblies be in opposition so as to push the closed-loop magnetron field lines inwardly away from the very edge of the magnetron-sputter target. Accordingly, in the claims, the term "first pole-type" refers to either an N-pole or an S-pole, as appropriate. A same pole-type of another magnet would be referred to as "said first pole-type". An opposite pole-type would be referred to as an "opposite pole-type" or a "second pole-type".

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. A method for depositing a thin film of a metal on a substrate in a magnetron sputter deposition chamber, comprising the steps of:

supplying a collimator assembly between a sputter target comprising the metal to be deposited and the substrate;

supplying a plasma support gas to the chamber through an inlet which causes said plasma support gas to enter the sputter deposition chamber in a region between said collimator assembly and said sputter target;

operating the magnetron sputter deposition chamber at a plasma support gas pressure of less than or equal to about 1.0 millitorr;

applying a negative potential to said sputter target so as to strike a plasma discharge in the magnetron sputter deposition chamber;

rotating a closed-loop balanced magnetron assembly in a first plane about a rotation axis, said magnetron assembly having a plurality of permanent magnetron magnets, each of said magnetron magnets having a N-S polar axis oriented substantially parallel to said first plane, all of said magnetron magnets arranged so that first pole-type thereof is oriented outwardly from said rotation axis;

supplying a ring-shaped bucking magnet assembly at a periphery of said sputter target and about said rotation axis and disposed generally in a second plane parallel to said first plane, said bucking magnet assembly having a plurality of permanent bucking magnets, each of said bucking magnets having a N-S polar axis oriented substantially parallel to said second plane, all of said bucking magnets oriented so that said first pole-type thereof is oriented inwardly toward said rotation axis; and injecting electrons in the vicinity of and directed toward a plasma forming region adjacent said sputter target and into said plasma discharge.

2. A method according to claim 1 wherein said injecting step is accomplished by locating an electron field emission probe adjacent to said second plane and biasing said probe so as to emit electrons toward said plasma discharge.

3. A method according to claim 1 wherein said injecting step is accomplished by locating an electron emission source adjacent to said second plane and biasing said electron emission source so as to emit electrons toward said plasma discharge.

4. A method according to claim 3 wherein said emission source comprises thoriated tungsten.

5. A method for depositing a thin film of a metal on a substrate in a magnetron sputter deposition chamber, comprising the steps of:

supplying a collimator assembly between a sputter target comprising the metal to be deposited and the substrate;

supplying a plasma support gas to the chamber through an inlet which causes said plasma support gas to enter the sputter deposition chamber between said collimator assembly and said sputter target;

operating the magnetron sputter deposition chamber at a plasma support gas pressure of less than or equal to about 1.0 millitorr;

applying a negative potential to said sputter target so as to strike a plasma discharge in the magnetron sputter deposition chamber;

rotating a closed-loop balanced magnetron assembly in a first plane about a rotation axis, said magnetron assembly having a plurality of permanent magnetron magnets, each of said magnetron magnets having a N-S polar axis oriented substantially parallel to said first plane, all of said magnetron magnets arranged so that a first pole-type thereof is oriented outwardly from said rotation axis; and supplying a ring-shaped bucking magnet assembly at a periphery of said sputter target and about said rotation axis and disposed generally in a second plane parallel to said first plane, said bucking magnet assembly having a plurality of permanent bucking magnets, each of said bucking magnets having a N-S polar axis oriented substantially parallel to said second plane, all of said bucking magnets oriented so that said first pole-type thereof is oriented inwardly toward said rotation axis.

6. A method according to claim 5 wherein said plasma support gas is Argon.

7. A magnetron sputter apparatus comprising:

a gas tight envelope;

a sputter target formed of a metal and disposed generally in a first plane;

first means for electrically biasing said sputter target and striking a plasma discharge about said sputter target;

a wafer chuck;

a closed loop rotating balanced magnetron disposed in a second plane parallel to said first plane and arranged for rotation about a rotation axis, said magnetron including a plurality of permanent magnetron magnets, each of said magnetron magnets having a N-S polar axis oriented substantially parallel to said second plane, all of said magnetron magnets arranged so that a first pole-type thereof is oriented outwardly from said rotation axis;

a ring-shaped bucking magnet assembly located at a periphery of said sputter target and about said rotation axis and disposed generally in a third plane substantially parallel to said first plane, said bucking magnet assembly having a plurality of permanent bucking magnets, each of said bucking magnets having a N-S polar axis oriented substantially parallel to said third plane, all of said bucking magnets oriented so that said first pole type thereof is oriented inwardly toward said rotation axis;

a collimation filter disposed between said sputter target and said wafer chuck; and means for injecting plasma support gas directly toward said plasma discharge while the magnetron sputter apparatus is in operation wherein said means for injecting plasma support gas is positioned so that said plasma support gas enters the magnetron sputter apparatus in a region located between said collimation filter and said sputter target.

8. An apparatus according to claim 7 further including means for injecting electrons into said plasma, comprising an electron field emission probe disposed adjacent to said sputter target.

9. An apparatus according to claim 7 further including means for injecting electrons into said plasma, comprising electron emission source disposed adjacent to said sputter target.

10. A magnetron sputter apparatus comprising:

a gas tight envelope;

a sputter target formed of a metal and disposed generally in a first plane;

first means for electrically biasing said sputter target and striking a plasma discharge about said sputter target;

a wafer chuck;

a closed loop rotating balanced magnetron disposed in a second plane parallel to said first plane and arranged for rotation about a rotation axis, said magnetron including a plurality of permanent magnetron magnets, each of said magnetron magnets having a N-S polar axis oriented substantially parallel to said second plane, all of said magnetron magnets arranged so that a first pole-type thereof is oriented outwardly from said rotation axis;

a ring-shaped bucking magnet assembly located at a periphery of said sputter target and about said rotation axis and disposed generally in a third plane substantially parallel to said first plane, said bucking magnet assembly having a plurality of permanent bucking magnets, each of said bucking magnets having a polar axis oriented substantially parallel to said third plane, all of said bucking magnets oriented so that said first pole type thereof is oriented inwardly toward said rotation axis;

a collimation filter disposed between said sputter target and said wafer chuck;

a dark space ring disposed between said sputter target and said wafer chuck, said dark space ring supplied with a source of a plasma support gas and at least one plasma support gas outlet, said outer directed generally toward a central axis of said dark space ring; and means for injecting plasma support gas directly toward said plasma discharge while the magnetron sputter apparatus is in operation, wherein said means for injecting plasma support gas is positioned so that said plasma support gas enters the magnetron sputter apparatus in a region located between said collimation filter and said sputter target.

11. A method for depositing a thin film of a metal on a substrate in a balanced magnetron sputter deposition chamber, comprising the steps of:

supplying a collimator assembly between a sputter target comprising the metal to be deposited and the substrate;

supplying a plasma support gas to the chamber through an inlet which directs said plasma support gas to a region located between said collimator assembly and said sputter target;

operating the magnetron sputter deposition chamber at a plasma support gas pressure of less than or equal to about 1.0 millitorr;

applying a negative potential to said sputter target so as to strike a plasma discharge in the magnetron sputter deposition chamber;

locating a closed-loop balanced magnetron assembly in a first plane about a central axis, said magnetron assembly having a plurality of permanent magnetron magnets, each of said magnetron magnets having a N-S polar axis oriented substantially parallel to said first plane, all of said magnetron magnets arranged so that first pole-type thereof is oriented outwardly from said central axis;

supplying a ring-shaped bucking magnet assembly at a periphery of said sputter target and about said central axis and disposed generally in a second plane parallel to said first plane, said bucking magnet assembly having a plurality of permanent bucking magnets, each of said bucking magnets having a N-S polar axis oriented substantially parallel to said second plane, all of said bucking magnets oriented so that said first pole-type thereof is oriented inwardly toward said central axis; and injecting electrons in the vicinity of and directed toward a plasma forming region within said region adjacent said sputter target and into said plasma discharge.

12. A method according to claim 11 wherein said injecting step is accomplished by locating an electron field emission probe adjacent to said second plane and biasing said probe so as to emit electrons toward said plasma discharge.

13. A method according to claim 11 wherein said injecting step is accomplished by locating an electron emission source adjacent to said second plane and biasing said electron emission source so as to emit electrons toward said plasma discharge.

14. A method according to claim 13 wherein said emission source comprises thoriated tungsten.

15. A method for depositing a thin film of a metal on a substrate in a balanced magnetron sputter deposition chamber, comprising the steps of:

supplying a collimator assembly between a sputter target comprising the metal to be deposited and the substrate;

supplying a plasma support gas to the chamber through an inlet which causes said plasma support gas to enter the sputter deposition chamber and be directed toward a region located between said collimator assembly and said target;

operating the magnetron sputter deposition chamber at a plasma support gas pressure of less than or equal to about 1.0 millitorr;

applying a negative potential to said sputter target so as to strike a plasma discharge in the magnetron sputter deposition chamber;

locating a closed-loop balanced magnetron assembly in a first plane about a central axis, said magnetron assembly having a plurality of permanent magnetron magnets, each of said magnetron magnets having a N-S polar axis oriented substantially parallel to said first plane, all of said magnetron magnets arranged so that a first pole-type thereof is oriented outwardly from said central axis; and supplying a ring-shaped bucking magnet assembly at a periphery of said sputter target and about said central axis and disposed generally in a second plane parallel to said first plane, said bucking magnet assembly having a plurality of permanent bucking magnets, each of said bucking magnets having a N-S polar axis oriented substantially parallel to said second plane, all of said bucking magnets oriented so that said first pole-type thereof is oriented inwardly toward said central axis.

16. A method according to claim 15 wherein said plasma support gas is Argon.

17. A magnetron sputter apparatus comprising:

a gas tight envelope;

a sputter target formed of a metal and disposed generally in a first plane;

first means for electrically biasing said sputter target and striking a plasma discharge about said sputter target;

a wafer chuck;

a closed loop balanced magnetron disposed in a second plane parallel to said first plane and arranged for rotation about a rotation axis, said magnetron including a plurality of permanent magnetron magnets, each of said magnetron magnets having a N-S polar axis oriented substantially parallel to said second plane, all of said magnetron magnets arranged so that a first pole-type thereof is oriented outwardly from said rotation axis;

a ring-shaped bucking magnet assembly located at a periphery of said sputter target and about said rotation axis and disposed generally in a third plane substantially parallel to said first plane, said bucking magnet assembly having a plurality of permanent bucking magnets, each of said bucking magnets having a polar axis oriented substantially parallel to said third plane, all of said bucking magnets oriented so that said first pole type thereof is oriented inwardly toward said rotation axis;

a collimation filter disposed between said sputter target and said wafer chuck and forming a region between said collimation filter and said sputter target; and means for injecting plasma support gas directly toward said plasma discharge while the magnetron sputter apparatus is in operation, wherein said means for injecting plasma support gas is arranged so that said plasma support gas enters the magnetron sputter apparatus in said region.

18. A magnetron sputter apparatus comprising:

a gas tight envelope;

a sputter target formed of a metal and disposed generally in a first plane;

first means for electrically biasing said sputter target and striking a plasma discharge about said sputter target;

a wafer chuck;

a closed loop balanced magnetron disposed in a second plane parallel to said first plane and arranged for rotation about a rotation axis, said magnetron including a plurality of permanent magnetron magnets, each of said magnetron magnets having a N-S polar axis oriented substantially parallel to said second plane, all of said magnetron magnets arranged so that a first pole-type thereof is oriented outwardly from said rotation axis;

a ring-shaped bucking magnet assembly located at a periphery of said sputter target and about said rotation axis and disposed generally in a third plane substantially parallel to said first plane, said bucking magnet assembly having a plurality of permanent bucking magnets, each of said bucking magnets having a polar axis oriented substantially parallel to said third plane, all of said bucking magnets oriented so that said first pole type thereof is oriented inwardly toward said rotation axis;

a collimation filter disposed between said sputter target and said wafer chuck; and means for injecting electrons directly toward said plasma discharge disposed in a region isolated from other parts of the gas tight envelope by said filter while the magnetron sputter apparatus is in operation.

19. An apparatus according to claim 18 wherein said means for injecting electrons comprises an electron field emission probe disposed adjacent to said sputter target.

20. An apparatus according to claim 19 further comprising means for injecting plasma support gas directly toward said plasma discharge while the magnetron sputter apparatus is in operation.

21. An apparatus according to claim 18 wherein said means for injecting electrons comprises an electron emission source disposed adjacent to said sputter target.

22. An apparatus according to claim 21 further comprising means for injecting plasma support gas directly toward said plasma discharge while the magnetron sputter apparatus is in operation.

23. A magnetron sputter apparatus comprising:

a gas tight envelope;

a sputter target formed of a metal and disposed generally in a first plane;

first means for electrically biasing said sputter target and striking a plasma discharge about said sputter target;

a wafer chuck;

a closed loop balanced magnetron disposed in a second plane parallel to said first plane and arranged for rotation about a rotation axis, said magnetron including a plurality of permanent magnetron magnets, each of said magnetron magnets having a N-S polar axis oriented substantially parallel to said second plane, all of said magnetron magnets arranged so that a first pole-type thereof is oriented outwardly from said rotation axis;

a ring-shaped bucking magnet assembly located at a periphery of said sputter target and about said rotation axis and disposed generally in a third plane substantially parallel to said first plane, said bucking magnet assembly having a plurality of permanent bucking magnets, each of said bucking magnets having a polar axis oriented substantially parallel to said third plane, all of said bucking magnets oriented so that said first pole type thereof is oriented inwardly toward said rotation axis;

a collimation filter disposed between said sputter target and said wafer chuck;

a dark space ring disposed between said sputter target and said wafer chuck, said dark space ring supplied with a source of a plasma support gas and at least one plasma support gas outlet, said outlet directed generally toward a central axis of said dark space ring; and means for injecting a plasma support gas directly toward said plasma discharge while the magnetron sputter apparatus is in operation wherein said means for injecting plasma support gas is arranged so that said plasma support gas is directed into the magnetron sputter apparatus in a region bounded on one side by said filter and on the opposite side by said sputter target.

* * * * *

UNITED STATES PATENT AND TRADEMARK OFFICE
CERTIFICATE OF CORRECTION

PATENT NO. : 5,702,573
DATED : December 30, 1997
INVENTOR(S) : Maximilian Biberger and Dennis Conci It is certified that error appears in the above-identified patent and that said Letters Patent is hereby corrected as shown below:

Column 3, line 8: replace "rations" with --ratios--.
Column 13, line 10: replace "outer" with --outlet--.

Signed and Sealed this

First Day of September, 1998

Attest:

BRUCE LEHMAN

*Attesting Officer*  *Commissioner of Patents and Trademarks*